(12) United States Patent
Feng et al.

(10) Patent No.: US 10,148,170 B2
(45) Date of Patent: Dec. 4, 2018

(54) SWITCHING POWER CONVERTER WITH MAGNETIZING CURRENT SHAPING

(71) Applicant: DIALOG SEMICONDUCTOR INC., Campbell, CA (US)

(72) Inventors: Guang Feng, Campbell, CA (US); Xiaoyan Wang, Campbell, CA (US); Nan Shi, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 0 days.

(21) Appl. No.: 15/824,927

(22) Filed: Nov. 28, 2017

(65) Prior Publication Data

US 2018/0091041 A1    Mar. 29, 2018

Related U.S. Application Data

(63) Continuation of application No. PCT/US2015/057243, filed on Oct. 23, 2015.

(51) Int. Cl.
| | | |
|---|---|---|
| *H02M 3/335* | (2006.01) | |
| *H02M 1/42* | (2007.01) | |
| *H02M 3/158* | (2006.01) | |
| *H03K 5/08* | (2006.01) | |
| *H02M 1/00* | (2006.01) | |

(52) U.S. Cl.
CPC ....... *H02M 1/4258* (2013.01); *H02M 3/1582* (2013.01); *H02M 3/33507* (2013.01); *H03K 5/086* (2013.01); *H02M 2001/0012* (2013.01); *H02M 2001/0025* (2013.01); *H02M 2001/0064* (2013.01)

(58) Field of Classification Search
CPC ........ H02M 2001/0009; H02M 1/4258; H05B 33/0815; H05B 33/0809; G05F 5/02
USPC ............. 363/16–17, 20, 21.07, 21.08, 21.12, 363/21.18; 315/201–207, 192, 292, 291
See application file for complete search history.

(56) References Cited

U.S. PATENT DOCUMENTS

| | | | |
|---|---|---|---|
| 5,359,276 A | 10/1994 | Mammano | |
| 7,433,211 B1 | 10/2008 | Collmeyer | |
| 8,508,147 B2 * | 8/2013 | Shen ................. | H05B 33/0815 315/200 R |
| 8,593,129 B2 * | 11/2013 | Gaknoki ............ | H05B 33/0815 323/241 |
| 9,167,664 B2 * | 10/2015 | Xie ........................ | H05B 37/02 |
| 9,184,661 B2 * | 11/2015 | Melanson ............. | H02M 3/335 |
| 9,246,391 B2 * | 1/2016 | Berghegger ....... | H02M 3/33507 |
| 9,660,547 B1 * | 5/2017 | Melanson ............... | H02M 7/06 |

(Continued)

OTHER PUBLICATIONS

PCT Search Report and Written Opinion dated Jul. 27, 2016 from corresponding International Application No. PCT/US2015/057243 filed Oct. 23, 2015.

(Continued)

*Primary Examiner* — Rajnikant Patel
(74) *Attorney, Agent, or Firm* — Haynes and Boone, LLP (57) ABSTRACT

A switching power converter is provided that uses at least two peak current thresholds. In particular, the switching power converter clamps a desired peak current to not fall below a low peak current threshold value while a rectified input voltage is decreasing and to not fall below a high peak current threshold value subsequent to zero crossing times for an AC input voltage.

20 Claims, 7 Drawing Sheets

(56) References Cited

U.S. PATENT DOCUMENTS

| | | | |
|---|---|---|---|
| 2012/0242238 A1* | 9/2012 | Chen .................. | H05B 33/0815 |
| | | | 315/200 R |
| 2014/0028214 A1* | 1/2014 | Mazumdar ......... | H05B 33/0818 |
| | | | 315/279 |
| 2015/0078047 A1 | 3/2015 | Sutardja et al. | |
| 2015/0200599 A1 | 7/2015 | Mao et al. | |

OTHER PUBLICATIONS

International Preliminary Report on Patentability dated Sep. 15, 2017 from corresponding International Application No. PCT/US2015/057243 filed Oct. 23, 2015.

* cited by examiner

SWITCHING POWER CONVERTER WITH MAGNETIZING CURRENT SHAPING

CROSS-REFERENCE TO RELATED APPLICATIONS

This application is a continuation of International Application No. PCT/US2015/057243 filed Oct. 23, 2015, which is hereby incorporated by reference in its entirety.

TECHNICAL FIELD

This application relates to switching power converters, and more particularly to a switching power converter with magnetizing current shaping.

BACKGROUND

Single-stage AC-DC power conversion is a low cost and thus popular power supply topology for applications such as solid state lighting. An important parameter for a single-stage AC-DC power switching converter is its power factor, which is the ratio of the real power delivered by the AC mains to the single-stage AC-DC switching power converter as compared to the apparent power delivered to the single-stage AC-DC switching power converter. The apparent power is insensitive to the phasing between the input current and voltage in contrast to the real power. The power factor is thus lowered if the input current and voltage are out of phase. The rectified input voltage to a single-stage AC-DC switching power converter cycles from approximately zero volts to the peak line voltage (e.g., 120 V*1.414 in the US) at twice the frequency for the AC mains. Given this sinusoidal pulsing or cycling of the rectified input voltage, the input current should have a similar profile to achieve a high power factor such as by the use of a suitably-modified peak current or constant on time control methodology.

Figure 1A:
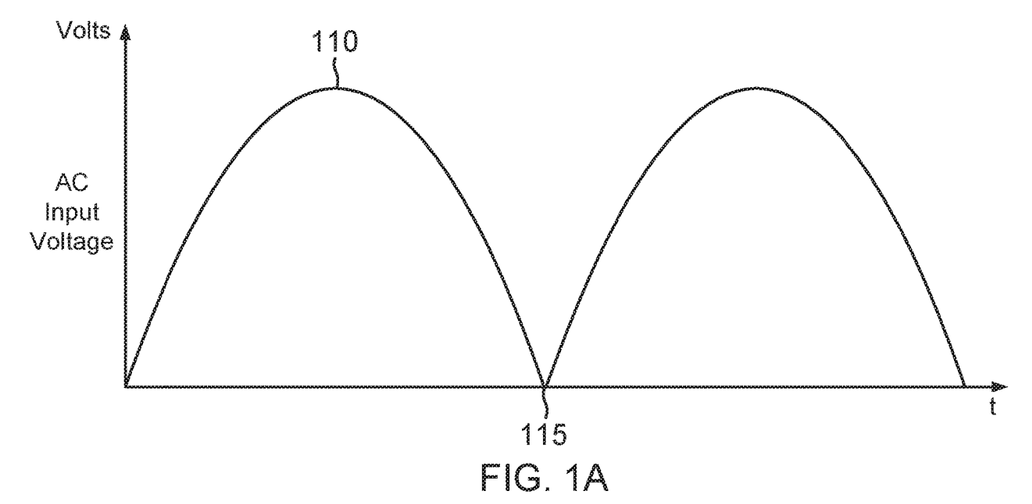
FIG. 1A illustrates a rectified input voltage.
Figure 1B:
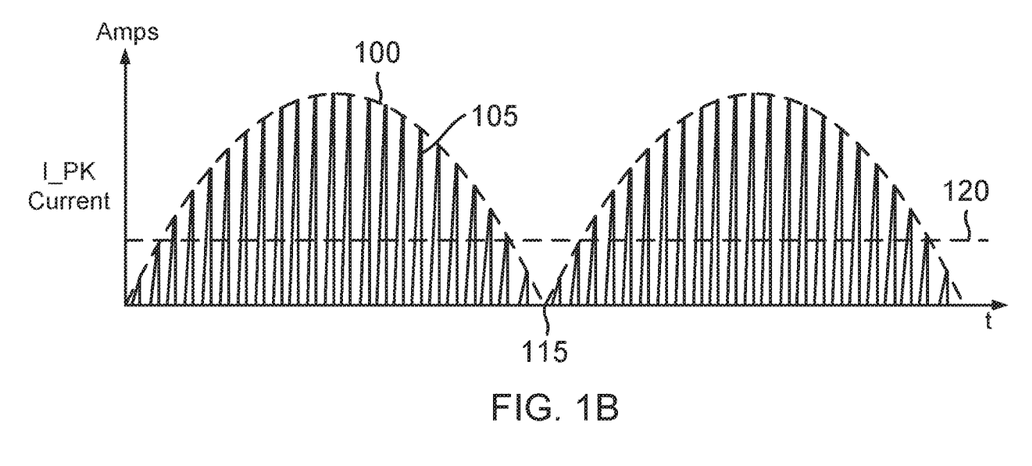
FIG. 1B illustrates a peak current profile shaped according to the profile for the rectified input voltage of FIG. 1A

To achieve high power factor in a single stage power converter, it is conventional to use either a peak current control methodology or a constant on-time control methodology. In both these techniques as shown in FIG. 1B, an input current 105 repeatedly pulses on and rises to a peak value before cycling off. Input current 105 may also be referred to as a magnetizing current. The peak value for input current 105 for each cycle has a profile or threshold envelope 100 that is similar to a rectified input voltage 110 for the switching power converter as shown in FIG. 1A so that a high power factor is achieved. But note that peak current profile 100 decreases down to zero at an AC input current zero crossing point 115. Should the input current be supplied by a triac as is conventional for dimming purposes in solid state lighting applications, this decrease in peak current profile 100 is problematic as a triac requires a minimum triac holding current threshold 120 to operate. The triac would thus reset as peak current profile 100 dips below minimum triac holding current threshold 120. The triac will continue to reset until peak current profile 100 again rises above minimum triac holding current threshold 120. The result of this multi-firing of the triac is that a user of a solid state lighting application such as an LED light powered by a high-power-factor single-stage power converter suffers from flicker. In addition, the switching power converter is subject to thermal stress.

Figure 2:
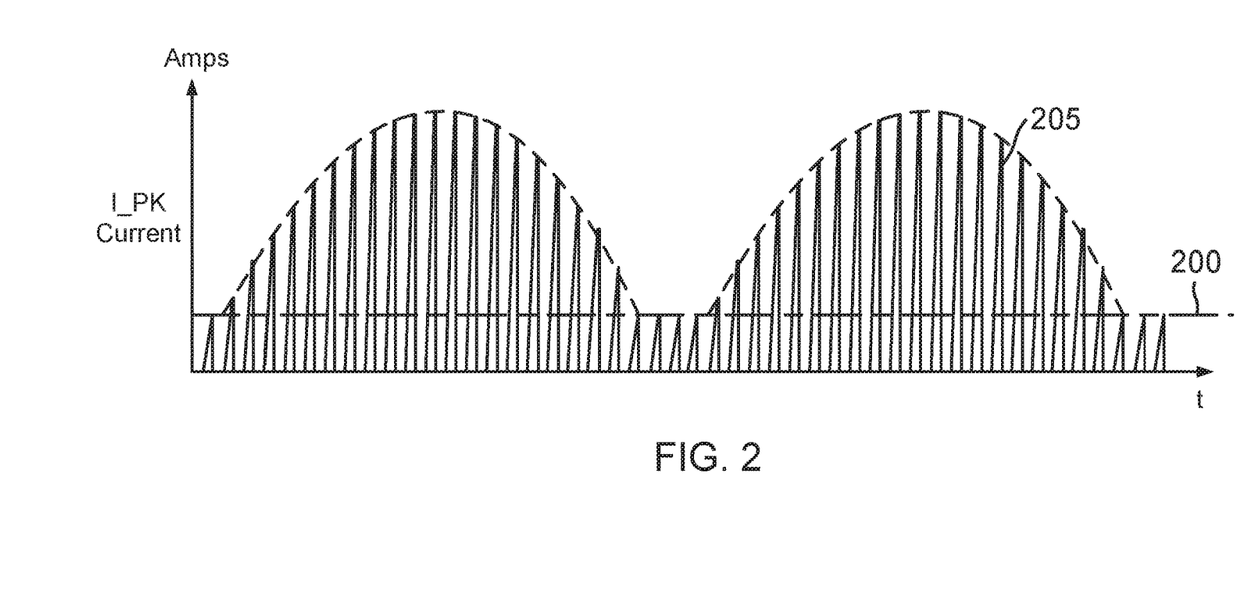
FIG. 2 illustrates a peak current profile clamped according to a conventional low peak current threshold.

To alleviate the flicker and thermal stress caused by multi-firing of the triac, it is conventional to implement a minimum peak current threshold 200 as shown in FIG. 2 for a peak current profile 205. Minimum peak current threshold 200 is chosen such that the resulting peak magnetizing current does not fall below minimum triac holding current threshold 120 discussed with regard to FIG. 1B. Although the triac is thus inhibited from resetting, the power factor is worsened as the rectified input voltage and peak current profiles then differ as the rectified input voltage drops below minimum peak current threshold 200. A tradeoff must thus be achieved between increasing the power factor and decreasing the likelihood of triac reset. Note that minimizing cost is critical in solid state lighting applications such that is conventional to eliminate the use of a snubber for the rectified input voltage. But the snubber elimination worsens the tradeoff as minimum peak current threshold 200 must typically be increased in snubber-less embodiments.

Accordingly, there is a need in the art for single-stage power converters having robust power factor correction while having sufficient triac holding current.

SUMMARY

A switching power converter is provided that clamps a peak value for a magnetizing current according to at least two thresholds. In particular, the switching power converter varies the clamping as a function of zero crossing times for an AC input voltage or current. While a rectified input voltage declines approaching each zero crossing time, the switching power converter clamps the peak current responsive to a low peak current threshold. In contrast, the switching power converter clamps the peak current responsive to a high peak current threshold after each zero crossing time while the rectified input voltage is increasing.

These advantageous features may be better appreciated through a consideration of the detailed description below.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

The disclosed switching power converter exploits the conventional operation of a dimmer control unit that determines whether dimming is being applied. Given such a determination, the switching power converter invokes a dimming mode in which a relatively large peak minimum current threshold is used. In that regard, it is conventional to also invoke a bleed circuit to maintain a sufficient holding current for the triac during the dimming application. Flicker is thus controlled during the dimming application. But a user may dial the dimmer switch such that full power is applied to the switching power converter. A zero or no-dimmer mode of operation is then invoked. It is during the no-dimmer mode of operation that a switching power converter must satisfy some required power factor level. As discussed previously, the maintenance of a high power factor is at odds with keeping a sufficient holding current for the triac in a leading edge dimmer such that the risk of flicker is increased.

To address the need for an improved power factor in single-stage AC-DC switching power converters while providing sufficient triac holding current for a leading edge dimmer switch during a no-dimmer mode of operation, the minimum peak current threshold for the magnetizing current is changed as a function of whether the rectified input voltage is increasing away from or decreasing towards the AC input voltage zero crossing. While the rectified input voltage falls towards zero, the disclosed switching power converter uses a relatively low peak current threshold. But as the rectified input voltage rises from zero, the switching power converter uses a relatively higher peak current threshold. In this fashion, the peak current profile may drop in phase with the rectified input voltage as it drops towards zero so that a relatively high power factor is achieved. But as the rectified input voltage increases from zero, the relatively high minimum peak current threshold keeps the triac holding current sufficiently high so that the triac does not suffer from any repeated resetting due to failure to maintain a sufficient holding current during the rising edge for the rectified input voltage.

Figure 3:
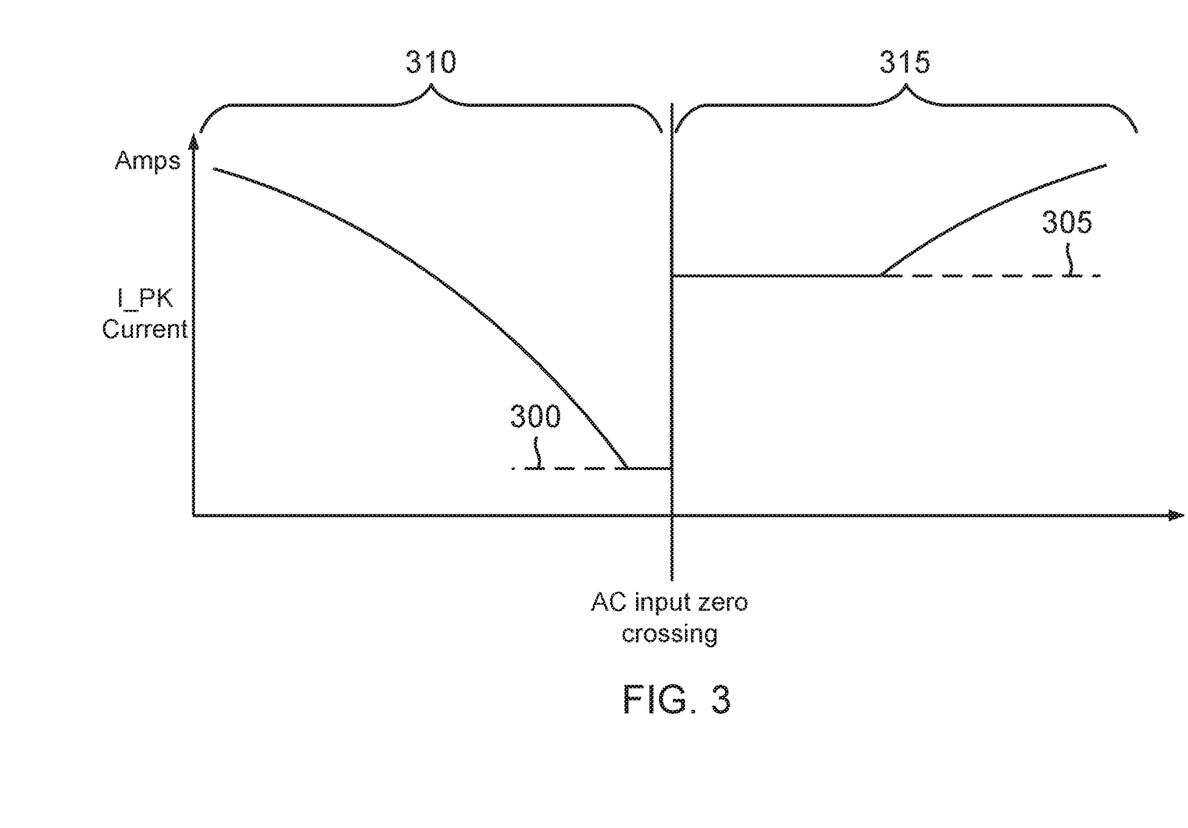
FIG. 3 illustrates a peak current profile clamped according to an aspect of the disclosure.

A pair of example minimum peak current thresholds are shown in FIG. 3. As the peak input (I_PK) current drops towards zero in falling-edge half cycle 310, the corresponding switching power converter invokes a "LOW" I_PK threshold 300. The cycling of the corresponding input current is not shown in FIG. 3 for illustration clarity. As the input current rises from zero during a rising-edge half cycle 315, the switching power converter invokes a "HIGH" I_PK threshold 305. Referring again to FIG. 1A, it may be seen that the peak current profile during falling-edge half cycle 310 closely mimics the corresponding fall of rectified input voltage 110 such that the power factor is significantly boosted. Although the power factor drops during half cycle 315, the increased input current to the switching power converter maintains a sufficient holding current for the triac in the corresponding leading edge dimming switch.

Figure 4:
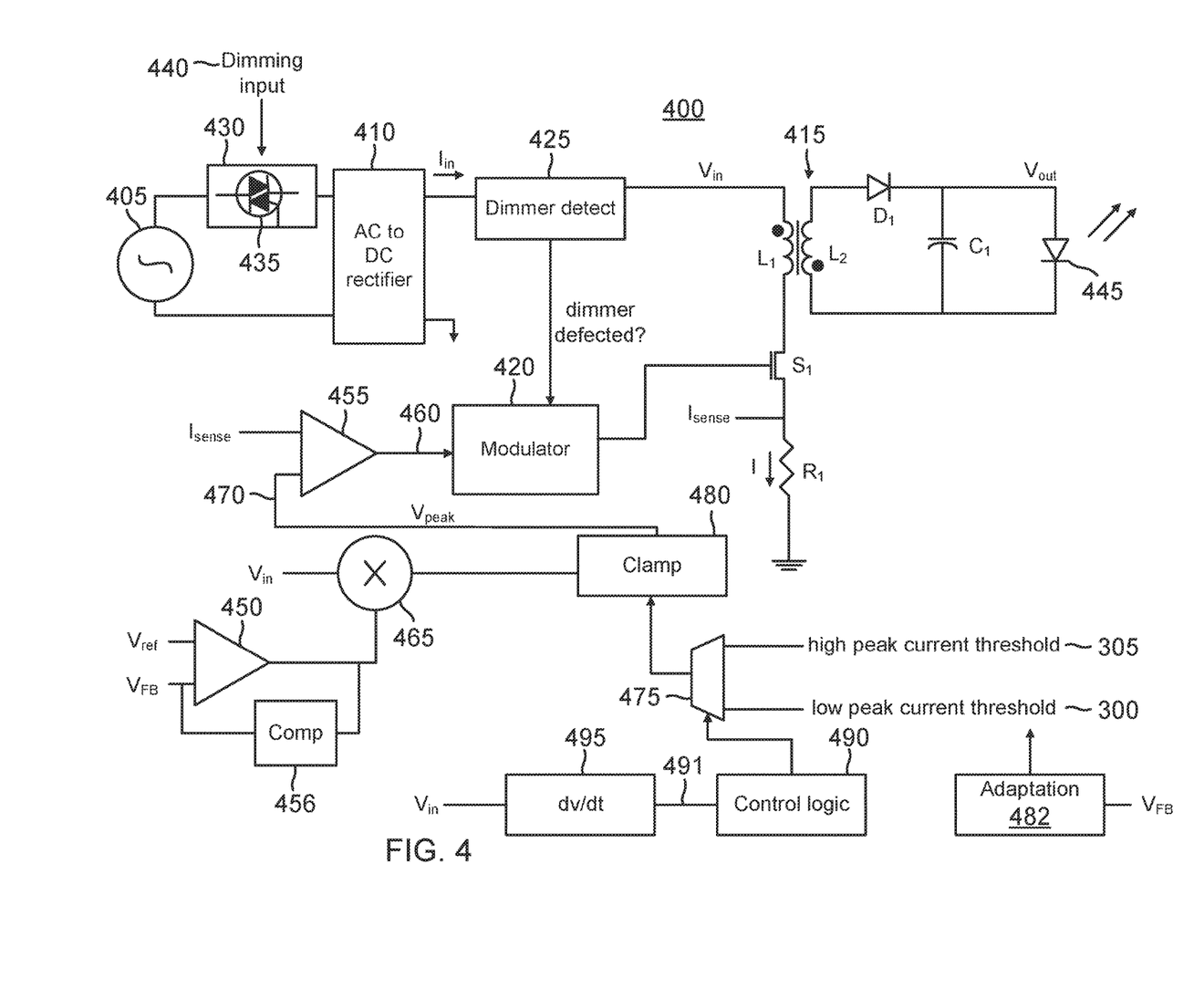
FIG. 4 is a circuit diagram of a flyback converter in accordance with an aspect of the disclosure.

An example switching power converter 400 configured to use low and high peak current thresholds 300 and 305 is shown in FIG. 4. In this embodiment, switching power converter 400 is a flyback converter but it will be appreciated that converter 400 may be readily altered to form a DC-to-DC converter such as a buck-boost converter. An AC-to-DC rectifier 410 such as a bridge rectifier rectifies the AC line voltage from AC mains 405 to produce rectified input voltage Vin. This rectified input voltage Vin causes a magnetizing current to flow through a primary winding L1 of a transformer 415 when a power switch S1 is switched on. In converter 400, switch S1 comprises an NMOS field effect transistor but it will be appreciated that other types of switches such as a bipolar junction transistor may be used in alternative embodiments. While switch S1 is on, a diode D1 on the secondary side of transformer 415 is reverse biased such that no current is flowing through second winding L2. When switch S1 switches off, the stored magnetic energy developed from the magnetizing current causes the voltage across L2 to "flyback" such that diode D1 is forward biased and current flows into an output capacitor C1 to charge an output voltage Vout accordingly.

A modulator 420 such as a pulse width modulator and/or a pulse frequency modulator controls the cycling of power switch S1 to regulate the output voltage Vout at a desired level. Modulator 420 is configured to change the modulation of the power switch cycling in response to a no-dimmer signal from a dimmer detect circuit 425. In that regard, flyback converter 400 includes a leading edge dimmer circuit 430 including a triac 435 coupled between AC mains 405 and rectifier 410. The input current Iin for flyback converter 400 from rectifier 410 is thus also the holding current for triac 435. As a user changes a dimming input 440 to dimmer circuit 430 to apply dimming to a light emitting diode (LED) 445, dimmer detect circuit 425 detects the resulting phase cut in the input current Iin to determine the presence of dimming. Conversely, if a user driving dimming input 440 so that full power is applied to LED 445 with no phase cutting of the input current Iin, dimmer detect circuit 425 does not detect the presence of dimming.

If dimming is detected, modulator 420 modulates the cycling of power switch S1 in a dimming mode of operation such as is known in the power converter arts. During the application of dimming as detected through dimming detector circuit 425, a bleed circuit (not illustrated) may also be activated so that a sufficient holding current is drawn through triac 435. Should dimmer detect circuit 425 detect no dimming, modulator 420 enters a high power factor correction (PFC) mode. In flyback converter 400, a peak current control method is implemented to provide PFC but it will be appreciated that alternative control methods such as a constant on-time method may also be implemented to provide the desired power factor. Regardless of the control methodology during the high PFC mode in which no dimming is detected, the output voltage Vout is sampled to produce a feedback voltage VFB. For example, a primary-only feedback method may be used to produce the feedback voltage. Alternatively, an opto-isolator may be used to sample the output voltage Vout to produce the feedback voltage. Regardless of how the feedback voltage is sampled, it may be compared to a reference voltage Vref in a differential amplifier 450 to produce an error signal that may be filtered through a compensation filter 456 and cycled back into differential amplifier 45 with the feedback voltage. A sense resistor R1 couples between ground and a source for power switch S1 to provide a sense voltage Isense that represents the magnitude of the magnetizing current flowing through primary winding L1. A multiplier 465 multiplies the error signal with the rectified input voltage to produce a peak current (Vpeak) command signal that is compared with the sense voltage Isense in a comparator 455 to produce a pulse width modulation (PWM) switch off signal 460. For example, modulator 455 may switch power switch S1 on cyclically in response to a clock signal. The assertion of PWM switch off signal 460 thus determines the pulse width for a given cycle of the power switch S1 in such an embodiment.

With no further processing, the peak current command signal would produce a peak current profile 100 as discussed with regard to FIG. 1B. But such a peak current profile may then trigger undesirable resetting of triac 435 to produce a flickering of LED 445. This flickering also subjects the components of flyback converter 400 to heat stress. To prevent these undesirable effects, a clamp circuit 480 clamps peak current command 470 from falling below a peak current threshold from a multiplexer 475 that selects between high peak current threshold 305 and low peak current threshold 300. To control multiplexer 475, flyback converter 400 may include a differentiator 495 that drives an output signal 491 responsive to whether the rectified input voltage Vin is increasing or decreasing. A control logic circuit 490 processes output signal 491 to control multiplexer 475 to select between high peak current threshold 305 and low peak current threshold 300. Logic circuit 490 may also be responsive to a zero crossing detection for the AC input voltage. For example, a comparator (not illustrated) may compare the current sense signal Isense to a zero crossing threshold (e.g., 10 V) to determine whether a zero crossing has occurred. During the rising edge half cycle following a zero crossing, control logic circuit 490 may thus control multiplexer 475 to select for high peak current threshold 305. Conversely during the falling edge half cycle prior to a zero crossing, control logic circuit 490 may control multiplexer 475 to select for low peak current threshold 300. In this fashion, the peak magnetizing current through primary winding L1 is clamped from falling below the selected peak current threshold from multiplexer 475.

To better appreciate these advantageous clamping of the peak magnetizing current using at least two thresholds, consider again the rising edge half cycle for rectified input voltage 110 of FIG. 1A following AC input current zero crossing time 115. Just after crossing time 115, the magnitude of rectified input voltage 110 is relatively small. Referring again to FIG. 4, such a small value for Vin as multiplied through multiplier 465 produces a correspondingly small value for Vpeak command signal 470. Such a relatively small value would then cause PWM switch off signal 460 to trigger early as well so as to command modulator 420 to apply a relatively small pulse width to the cycling of power switch S1. But clamp 480 prevents Vpeak command signal 470 from falling below high peak current threshold 305 at such times so that a sufficient triac holding current is applied to triac 435.

Figure 5:
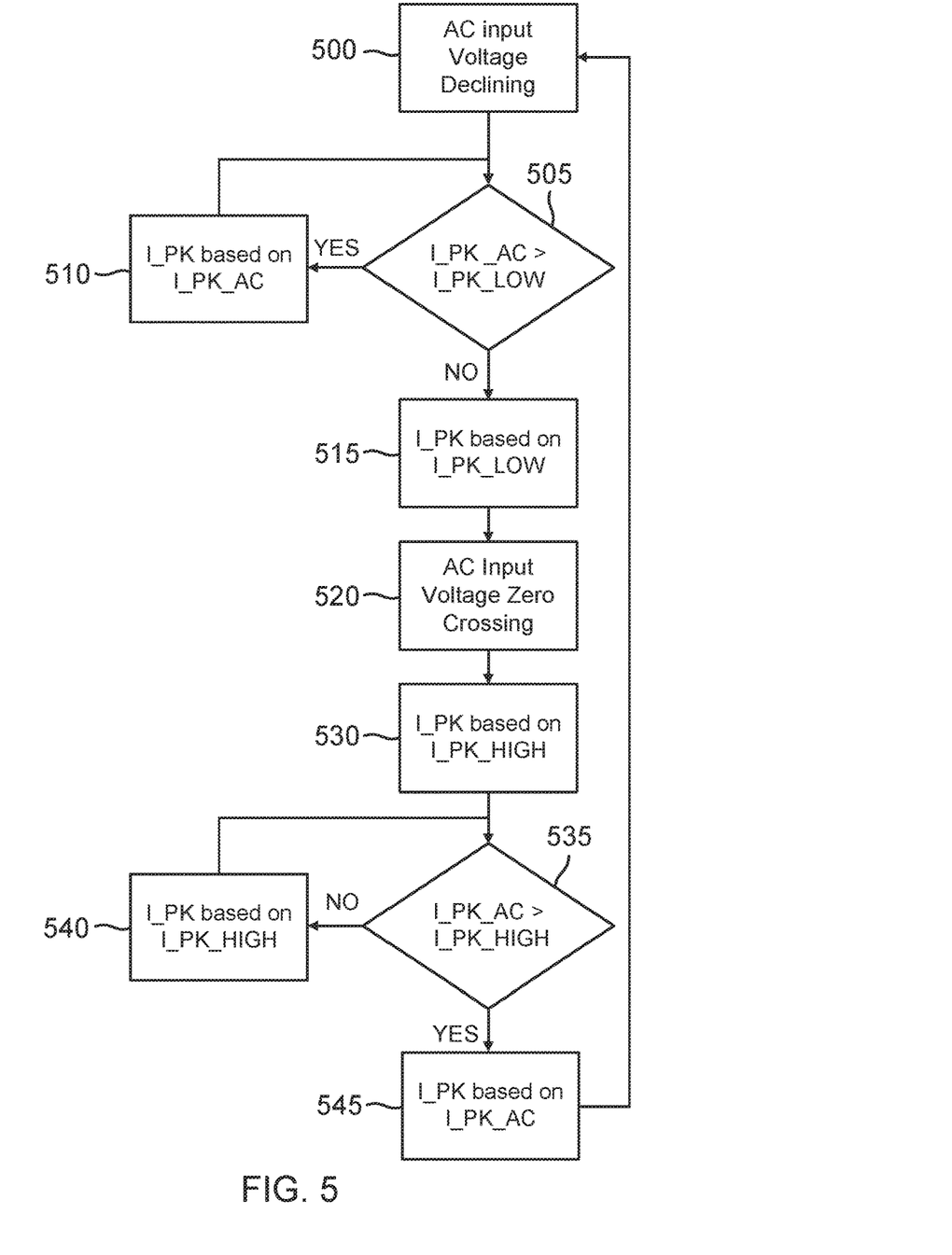
FIG. 5 is a flowchart for a method of clamping a peak current command in accordance with an aspect of the disclosure.

The control of the clamping of the peak current command 470 is summarized in the flowchart shown in FIG. 5. With regard to this method, the non-clamped peak current command is denoted as "I_PK_AC." This is the peak current command that would be produced, for example, by multiplier 465. Alternatively, I_PK_AC may correspond to the peak current command from a constant-on-time control methodology. The method begins with an act 500 of determining whether the AC input voltage is declining such as determined through the differentiation of the rectified input voltage discussed with regard to differentiator 495 of FIG. 4. An act 505 comprises determining whether the peak current command I_PK_AC is greater than low peak current threshold 300 (denoted in FIG. 5 as I_PK_LOW). If this determination is positive, peak current command 460 (denoted in FIG. 5 as I_PK) is set equal to I_PK_AC in an act 510. Conversely, if the determination in act 505 is negative, the method proceeds with an act 515 of clamping I_PK at I_PK_LOW.

Should a zero crossing be detected in an act 520, the method transitions to an act 530 of clamping I_PK at high peak voltage threshold 305, which is denoted in FIG. 5 as I_PK_HIGH. The method continues with an act 535 of determining whether I_PK_AC is greater than I_PK_HIGH. If this determination is negative, I_PK remains clamped at I_PK_HIGH in an act 540. Conversely, I_PK is based on I_PK_AC in an act 545 if the determination in act 535 is negative. The method then proceeds to loop back to act 505 should the AC input voltage decline again in act 500.

Figure 6:
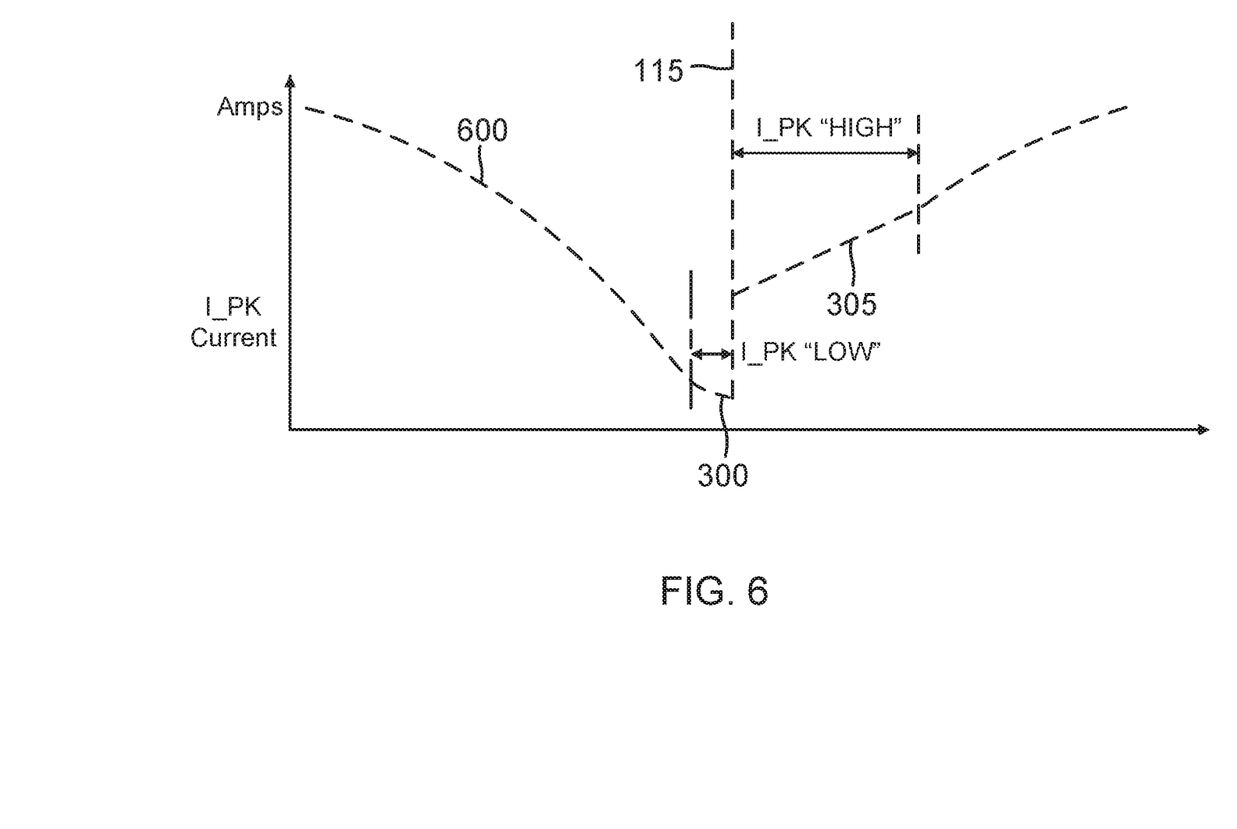
FIG. 6 illustrates a peak current profile clamped according to variable peak current thresholds in accordance with an aspect of the disclosure.

Referring again to FIG. 4, high peak current threshold 305 may be adapted in an adaptation circuit 482 responsive to, for example, the magnitude of the rectified input voltage. A peak current profile 600 is shown in FIG. 6 that results from an adaptation of thresholds 300 and 305. During an I_PK "LOW" period prior to zero crossing 115, peak current profile 600 is clamped according to a linearly-decreasing version of low peak current threshold 300. Similarly, during an I_PK "HIGH" period following zero crossing 115, peak current profile 600 is clamped according to a linearly-increasing version of high peak current threshold 305.

Figure 7:
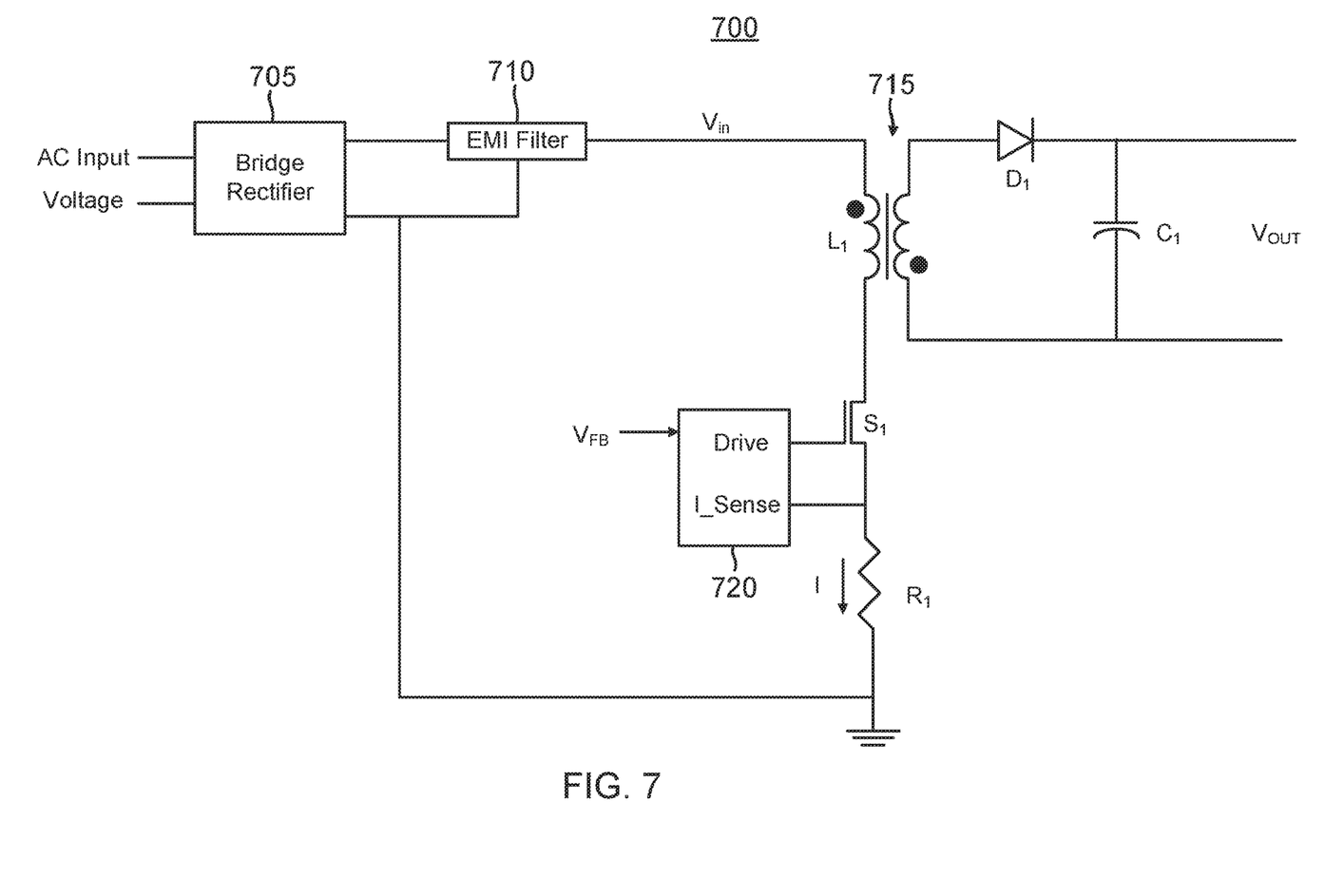
FIG. 7 illustrates a buck-boost converter including a controller configured to implement the method of FIG. 5.

The method discussed with regard to FIG. 5 may be applied to a wide variety of switching power converters. For example, a buck-boost switching power converter 700 is shown in FIG. 7 that includes a controller 720 configured to practice the method discussed with regard to FIG. 5. In converter 700, an AC input voltage is rectified through a bridge rectifier 705 and filtered through an electromagnetic interference (EMI) filter 710 to produce the rectified input voltage Vin that drives a magnetizing current into an inductor L1 when controller 720 cycles a power switch S1. Controller 720 is configured to control a peak current through inductor L1 that is clamped according to low and high peak current thresholds 300 and 305 analogously as discussed with regard to the control of the power switch in flyback converter 400.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

The invention claimed is:

1. A method, comprising
    rectifying an AC input voltage to produce a rectified input voltage;
    determining a desired peak current through a power factor control (PFC) feedback loop;
    setting a peak current threshold to equal a first threshold value prior to a zero crossing time for the AC input voltage and to equal a second threshold value after the zero crossing time, wherein the first threshold value is less than the second threshold value; and
    cycling a power switch so that power switch conducts a magnetizing current equaling the desired peak current when the desired peak current exceeds the peak current threshold and so that the power switch conducts a magnetizing current equaling the peak current threshold when the desired peak current is less than the peak current threshold.

2. The method of claim 1, wherein the rectified input voltage is decreasing from a maximum value prior to the zero crossing time and is increasing following the each zero crossing time.

3. The method of claim 1, wherein cycling the power switch conducts the magnetizing current through a primary winding in a flyback converter.

4. The method of claim 1, wherein cycling the power switch conducts the magnetizing current through an inductor in a DC-DC switching power converter.

5. The method of claim 4, wherein the cycling the power switch conducts the magnetizing current through an inductor in a buck-boost converter.

6. The method of claim 1, wherein determining the desired peak current comprises comparing a feedback voltage to a reference voltage to determine an error signal.

7. The method of claim 6, wherein determining the desired peak current further comprising multiplying the error signal with the rectified input voltage to produce the desired peak current.

8. The method of claim 1, wherein cycling the power switch comprises cycling a MOSFET.

9. The method of claim 8, wherein cycling the MOSFET comprises cycling the MOSFET according to a pulse width modulation.

10. A switching power converter, comprising:
a power switch;
a dimmer configured to apply a phase cut dimming to an AC input voltage responsive to a dimming command to produce a processed AC input voltage;
a dimmer detection circuit configured to determine whether the dimmer applied the phase cut dimming to the processed AC input voltage;
a controller including a power factor control (PFC) feedback loop configured to determine a desired peak current responsive to a determination by the dimmer detection circuit that the dimmer applied the phase cut dimming, and wherein, prior to a zero crossing time for the AC input voltage, the controller is further configured to cycle the power switch to conduct a first magnetizing current equaling the desired peak current while the desired peak current is greater than a first threshold and to clamp the first magnetizing current to equal the first threshold while the desired peak current is less than the first threshold, and wherein, subsequent to the zero crossing time for the AC input voltage, the controller is further configured to cycle the power switch to conduct a second magnetizing current equaling the desired peak current while the desired peak current is greater than a second threshold and to clamp the second magnetizing current to equal the second threshold while the desired peak current is less than the second threshold, wherein the second threshold is greater than the first threshold.

11. The switching power converter of claim 10, wherein the dimmer is a leading edge dimmer.

12. The switching power converter of claim 10, wherein the switching power converter is a DC-DC switching power converter, and wherein the power switch couples to an inductor for the DC-DC switching power converter.

13. The switching power converter of claim 12, wherein DC-DC switching power converter is a buck-boost converter.

14. The switching power converter of claim 10, wherein the switching power converter is a flyback converter, and wherein the power switch couples to a primary winding for the flyback converter.

15. The switching power converter of claim 10, further comprising an AC-DC rectifier configured to rectify the processed AC input voltage into a rectified input voltage.

16. The switching power converter of claim 15, wherein the controller includes a differentiator configured to determine whether the rectified input voltage is decreasing, and wherein the controller is further configured to clamp the desired peak current to the first threshold prior to the zero crossing time responsive to the differentiator determining that the rectified input voltage is decreasing.

17. The switching power converter of claim 10, further comprising:
an error amplifier configured to compare a feedback voltage to a reference voltage to produce an error signal.

18. The switching power converter of claim 17, further comprising:
a multiplier configured to multiply the error signal with the rectified input voltage to produce the desired peak current; and
a clamp configured to clamp the desired peak current at the second threshold subsequent to the zero crossing time for the AC input voltage and to clamp the desired peak current at the first threshold second value prior to the zero crossing time.

19. The switching power converter of claim 15, wherein the controller is further configured to adapt at least the first threshold responsive to the rectified input voltage.

20. The switching power converter of claim 10, wherein the dimmer includes a triac having a holding current supported by the controller.

* * * * *